(12) United States Patent
Akiyoshi et al.

(10) Patent No.: US 10,874,014 B2
(45) Date of Patent: Dec. 22, 2020

(54) ROTARY ELECTRIC MACHINE INCLUDING RECTIFYING PARTS AND INTAKE PARTS

(71) Applicant: Mitsubishi Electric Corporation, Tokyo (JP)

(72) Inventors: Masao Akiyoshi, Tokyo (JP); Yuzuru Kobayashi, Tokyo (JP); Kentaro Honsho, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 358 days.

(21) Appl. No.: 15/560,521

(22) PCT Filed: Apr. 28, 2015

(86) PCT No.: PCT/JP2015/062795
§ 371 (c)(1),
(2) Date: Sep. 22, 2017

(87) PCT Pub. No.: WO2016/174731
PCT Pub. Date: Nov. 3, 2016

(65) Prior Publication Data
US 2018/0115214 A1    Apr. 26, 2018

(51) Int. Cl.
*H05K 1/02* (2006.01)
*H02K 9/02* (2006.01)
(Continued)

(52) U.S. Cl.
CPC ............. *H05K 1/0201* (2013.01); *H02K 5/04* (2013.01); *H02K 5/20* (2013.01); *H02K 9/02* (2013.01);
(Continued)

(58) Field of Classification Search
CPC .. H02K 5/20; H02K 9/02; H02K 9/28; H02K 11/048; H02K 19/365; H02K 5/18;
(Continued)

(56) References Cited

U.S. PATENT DOCUMENTS 7,723,875 B2    5/2010   Fakes
2004/0256924 A1   12/2004   Ueda et al.
(Continued)

FOREIGN PATENT DOCUMENTS

EP    2 091 136 A1    8/2009
JP    10-056760 A     2/1998
(Continued)

OTHER PUBLICATIONS

Extended European Search Report dated Nov. 15, 2018 issued by the European Patent Office in counterpart European application No. 15890715.4.
(Continued)

*Primary Examiner* — Shawki S Ismail
*Assistant Examiner* — Demetries A Gibson
(74) *Attorney, Agent, or Firm* — Sughrue Mion, PLLC; Richard C. Turner (57) ABSTRACT

A cover covering a rectifying device includes a cover end wall portion, a cover outer wall portion, and a cover intermediate portion interposed between the cover end wall portion and the cover outer wall portion. The cover end wall portion includes an inner peripheral side intake portion, and the cover intermediate portion includes an outer peripheral side intake portion. The outer peripheral side intake portion includes an axial direction covering portion existing in a position that is closer to a rotary electric machine main body than the cover end wall portion in an axial direction, and a radial direction covering portion that connects the axial direction covering portion to an outer peripheral portion of the cover end wall portion. Intake holes are provided respectively in the inner peripheral side intake portion, the axial direction covering portion, and the radial direction covering portion.

8 Claims, 7 Drawing Sheets

(51) Int. Cl.
  *H02K 5/04* (2006.01)
  *H02K 5/20* (2006.01)
  *H02K 9/28* (2006.01)
  *H02K 11/04* (2016.01)
  *H02K 19/36* (2006.01)

(52) U.S. Cl.
  CPC ............ *H02K 9/28* (2013.01); *H02K 11/048* (2013.01); *H02K 19/365* (2013.01); *H05K 1/0203* (2013.01); *H01L 2924/01013* (2013.01); *H01L 2924/01082* (2013.01)

(58) Field of Classification Search
  CPC ........ H01L 2924/01082; H05K 1/0201; H05K 1/0203; H05K 1/0204; H05K 11/30; H05K 11/33
  See application file for complete search history.

(56) References Cited

U.S. PATENT DOCUMENTS

| | | | | |
|---|---|---|---|---|
| 2006/0012253 | A1* | 1/2006 | Vasilescu | H02K 5/20 310/58 |
| 2006/0250035 | A1* | 11/2006 | Itou | H02K 5/225 310/68 D |
| 2007/0046114 | A1* | 3/2007 | Kondo | H01L 25/115 310/68 D |
| 2007/0252488 | A1* | 11/2007 | Kusase | H02K 5/20 310/68 D |
| 2010/0109454 | A1 | 5/2010 | Vadillo et al. | |
| 2012/0299449 | A1 | 11/2012 | Ishikawa et al. | |
| 2012/0306300 | A1 | 12/2012 | Ishikawa et al. | |
| 2014/0339931 | A1* | 11/2014 | Tanaka | H02K 11/046 310/52 |
| 2015/0295478 | A1* | 10/2015 | Creviston | H02K 5/225 310/68 D |
| 2016/0204676 | A1* | 7/2016 | Ziegler | H02K 9/06 392/379 |

FOREIGN PATENT DOCUMENTS

| | | |
|---|---|---|
| JP | 2004-282939 A | 10/2004 |
| JP | 3675048 B2 | 7/2005 |
| JP | 2007-068257 A | 3/2007 |
| JP | 2009-207274 A | 9/2009 |
| JP | 2012-244673 A | 12/2012 |
| JP | 5661167 B1 | 1/2015 |

OTHER PUBLICATIONS

International Search Report for PCT/JP2015/062795 dated Jun. 23, 2015 [PCT/ISA/210].

Written Opinion for PCT/JP2015/062795 dated Jun. 23, 2015 [PCT/ISA/237].

* cited by examiner

ROTARY ELECTRIC MACHINE INCLUDING RECTIFYING PARTS AND INTAKE PARTS

CROSS REFERENCE TO RELATED APPLICATIONS

This application is a National Stage of International Application No. PCT/JP2015/062795 filed Apr. 28, 2015, the contents of all of which are incorporated herein by reference in their entirety.

TECHNICAL FIELD

This invention relates to a rotary electric machine in which a rectifying device is provided in a rotary electric machine main body.

BACKGROUND ART

In a conventional rotary electric machine, a negative side diode is provided on a support frame that supports a rotor and a stator, a positive side diode is provided on a heat radiation plate that opposes the support frame in an axial direction, and the respective diodes are cooled by passing outside air through a radial direction flow passage formed between the support frame and the heat radiation plate. In this conventional rotary electric machine, an opposing plate that opposes an outer peripheral surface of a cover covering the heat radiation plate is provided on a radial direction outer side of the cover, and outside air is led between the support frame and the heat radiation plate by being passed through an axial direction flow passage formed between the outer peripheral surface of the cover and the opposing plate (see PTL 1, for example).

CITATION LIST

Patent Literature

[PTL 1] U.S. Pat. No. 7,723,875

SUMMARY OF INVENTION

Technical Problem

In this conventional rotary electric machine, however, the opposing plate must be disposed on the radial direction outer side of the outer peripheral surface of the cover, leading to an increase in the size of the rotary electric machine. Moreover, to suppress an increase in the size of the rotary electric machine, the axial direction flow passage may be narrowed by disposing the opposing plate closer to the cover outer peripheral surface, but in this case, pressure loss in the outside air flowing through the axial direction flow passage increases, leading to a reduction in the amount of outside air supplied to the interior of the rotary electric machine. When the amount of outside air supplied to the interior of the rotary electric machine decreases, a cooling performance obtained in relation to components such as the diodes in the interior of the rotary electric machine deteriorates.

This invention has been designed to solve the problems described above, and an object thereof is to obtain a rotary electric machine with which a cooling performance obtained in relation to a rectifying device can be improved while suppressing an increase in size.

Solution to Problem

A rotary electric machine according to this invention includes: a rotary electric machine main body having a stator, a rotor that rotates relative to the stator about an axis, a fan provided on an axial direction end portion of the rotor, and a frame that supports the stator and the rotor; a rectifying device attached to the frame about the axis, and disposed on an axial direction outer side of the rotary electric machine main body; and a cover covering the rectifying device, wherein the cover includes a cover end wall portion positioned on the axial direction outer side of the rectifying device, a cover outer wall portion positioned on a radial direction outer side of the rectifying device, and a cover intermediate portion interposed between the cover end wall portion and the cover outer wall portion, the cover end wall portion includes an inner peripheral side intake portion, the cover intermediate portion includes an outer peripheral side intake portion, the outer peripheral side intake portion includes an axial direction covering portion existing in a position that is closer to the rotary electric machine main body than the cover end wall portion in an axial direction, and a radial direction covering portion that connects the axial direction covering portion to an outer peripheral portion of the cover end wall portion, and intake holes are provided respectively in the inner peripheral side intake portion, the axial direction covering portion, and the radial direction covering portion.

Advantageous Effects of Invention

With the rotary electric machine according to this invention, a surface area of the outer peripheral side intake portion can be increased while suppressing an increase in the size of the cover. Hence, a speed of cooling air taken into the cover through the outer peripheral side intake portion can be reduced, and therefore pressure loss in the cooling air flowing through the cover can be reduced. Accordingly, an amount of cooling air taken into the cover can be increased, and as a result, a cooling performance obtained in relation to the rectifying device can be improved while suppressing an increase in the size of the rotary electric machine.

DESCRIPTION OF EMBODIMENTS

First Embodiment

Figure 1:
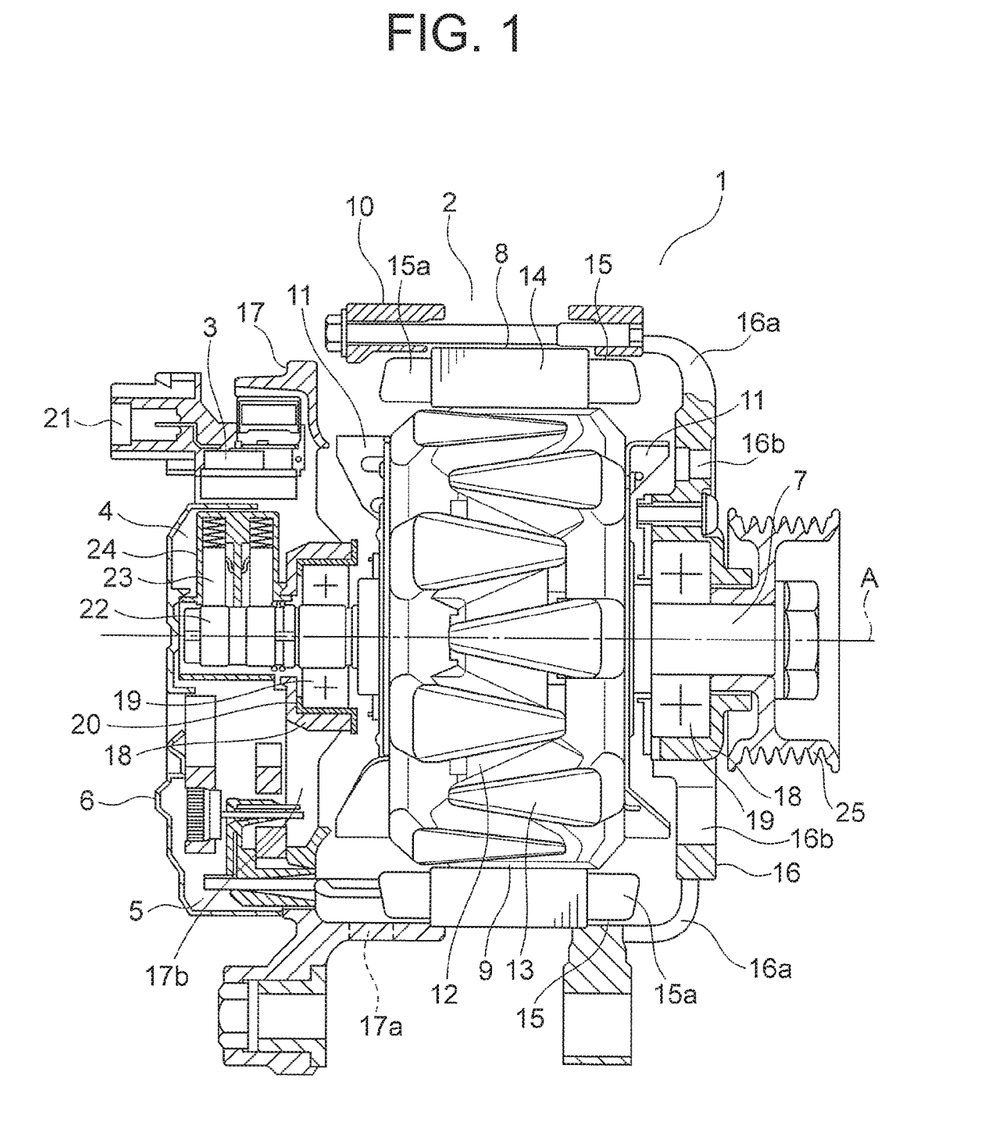
FIG. 1 is a longitudinal sectional view showing a vehicle AC power generator according to a first embodiment of this invention.

FIG. 1 is a longitudinal sectional view showing a vehicle AC power generator according to a first embodiment of this invention. In the figure, a vehicle AC power generator 1 includes: a power generator main body 2 serving as a rotary electric machine main body; a voltage regulator 3, a brush device 4, and a rectifying device 5 respectively attached to the power generator main body 2; and a cover 6 covering the voltage regulator 3, the brush device 4, and the rectifying device 5. The vehicle AC power generator 1 is a rotary electric machine installed in a vehicle such as an automobile, for example.

The power generator main body 2 includes a rotary shaft 7 having an axis A, a cylindrical stator 8 disposed coaxially with the rotary shaft 7, a rotor 9 disposed on an inner side of the stator 8 and fixed to the rotary shaft 7, a frame 10 that supports the rotary shaft 7, the stator 8, and the rotor 9, and fans 11 provided on respective axial direction end portions of the rotor 9 (in other words, respective end portions of the rotor 9 in the direction of the axis A).

The rotor 9 and the fans 11 rotate integrally with the rotary shaft 7 relative to the stator 8 about the axis A. The fans 11 generate cooling air by rotating integrally with the rotor 9. Further, the rotor 9 includes a field coil 12 that generates magnetic flux when an excitation current is fed thereto, and a pole core 13 on which the field coil 12 is provided and on which magnetic poles are formed by the magnetic flux of the field coil 12.

The stator 8 is fixed to the frame 10. Further, the stator 8 includes a cylindrical stator core 14 that surrounds an outer periphery of the rotor 9, and a plurality of stator coils 15 provided on the stator core 14. Respective axial direction end portions of the stator coils 15 project from respective axial direction end surfaces of the stator core 14 as coil ends 15*a*. When the magnetic flux of the field coil 12 varies as the rotor 9 rotates, AC electromotive force is generated in the respective stator coils 15.

The frame 10 includes a front bracket 16 and a rear bracket 17 formed from aluminum. The front bracket 16 and the rear bracket 17 are respectively formed to be substantially bowl-shaped. The front bracket 16 and the rear bracket 17 are fixed to each other by a plurality of bolts such that respective opening portions thereof oppose each other in the axial direction (i.e. the direction of the axis A) while sandwiching the stator core 14. As a result, the fan 11 fixed to one axial direction end portion of the rotor 9 is covered by the front bracket 16, and the fan 11 fixed to the other axial direction end portion of the rotor 9 is covered by the rear bracket 17.

Bearing attachment portions 18 are provided in respective centers of the front bracket 16 and the rear bracket 17. The rotary shaft 7 penetrates the respective bearing attachment portions 18 of the front bracket 16 and the rear bracket 17. Further, the rotary shaft 7 is supported by the front bracket 16 and the rear bracket 17 to be free to rotate via bearings 19 attached respectively to the bearing attachment portions 18. The bearing 19 is attached to the bearing attachment portion 18 of the rear bracket 17 via a folder 20.

A plurality of front side discharge holes 16*a* and a plurality of front side intake holes 16*b* are provided in the front bracket 16. The front side discharge holes 16*a* are provided in an outer peripheral portion of the front bracket 16. The front side intake holes 16*b* are provided in a part of the front bracket 16 positioned on the periphery of the bearing attachment portion 18, i.e. further toward an inner peripheral side than the front side discharge holes 16*a*.

A plurality of rear side discharge holes 17*a* and a plurality of rear side intake holes 17*b* are provided in the rear bracket 17. The rear side discharge holes 17*a* are provided in an outer peripheral portion of the rear bracket 17. The rear side intake holes 17*b* are provided in a part of the rear bracket 17 positioned on the periphery of the bearing attachment portion 18, i.e. further toward the inner peripheral side than the rear side discharge holes 17*a*.

The voltage regulator 3, the brush device 4, and the rectifying device 5 are attached to the rear bracket 17. Further, the voltage regulator 3, the brush device 4, and the rectifying device 5 are disposed about the axis of the rotary shaft 7 on an axial direction outer side of the power generator main body 2.

The voltage regulator 3 regulates a magnitude of an AC voltage generated by the stator coils 15. A connector 21 electrically connected to an external device, not shown in the figure, is attached to the rear bracket 17. The voltage regulator 3 communicates with the external device via the connector 21.

The brush device 4 includes a pair of slip rings 22 fixed to a part of the rotary shaft 7 that projects from the rear bracket 17, a pair of brushes 23 respectively contacting the slip rings 22, and a brush holder 24 that houses the brushes 23. When the rotary shaft 7 rotates, the slip rings 22 slide respectively against the brushes 23. A field current from a battery, not shown in the figure, is supplied to the field coil 12 of the rotor 9 through the brush device 4.

The rectifying device 5 rectifies an AC current generated by the stator coils 15 to a DC current. The rectifying device 5 is disposed so as to surround the periphery of the rotary shaft 7 while avoiding the voltage regulator 3, the brush device 4, and the connector 21.

A pulley 25 is fixed to a part of the rotary shaft 7 that projects from the front bracket 16. A transmission belt, not shown in the figure, coupled to an output shaft of an engine is wound around the pulley 25. Rotary torque from the engine is transmitted to the rotary shaft 7 from the output shaft of the engine via the transmission belt. When the rotary shaft 7 receives the rotary torque from the engine, the rotary shaft 7, the rotor 9, and the fans 11 rotate about the axis A.

Figure 2:
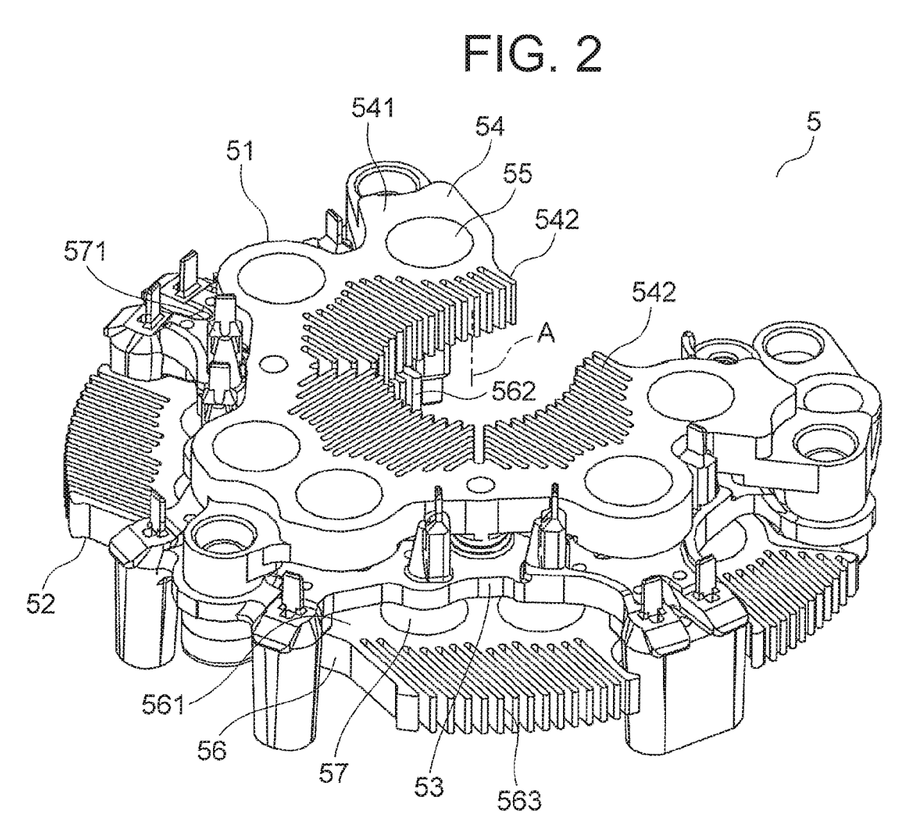
FIG. 2 is a perspective view showing a rectifying device as seen from a cover side in FIG. 1.
Figure 3:
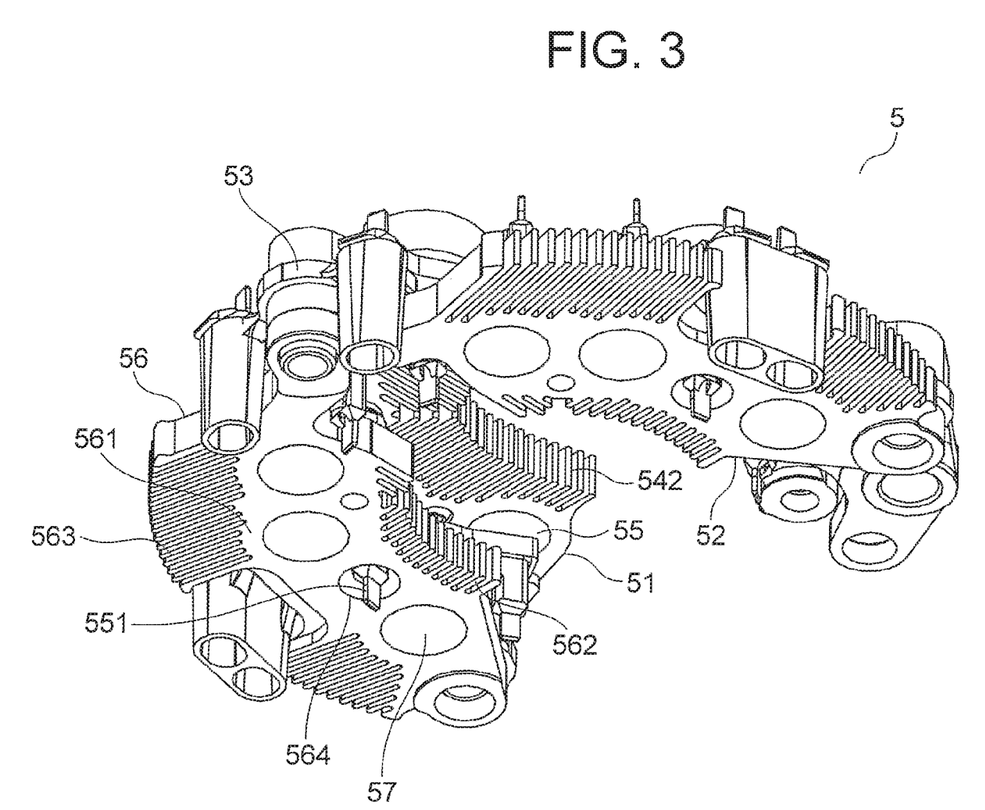
FIG. 3 is a perspective view showing the rectifying device as seen from a power generator main body side in FIG. 1.
Figure 4:
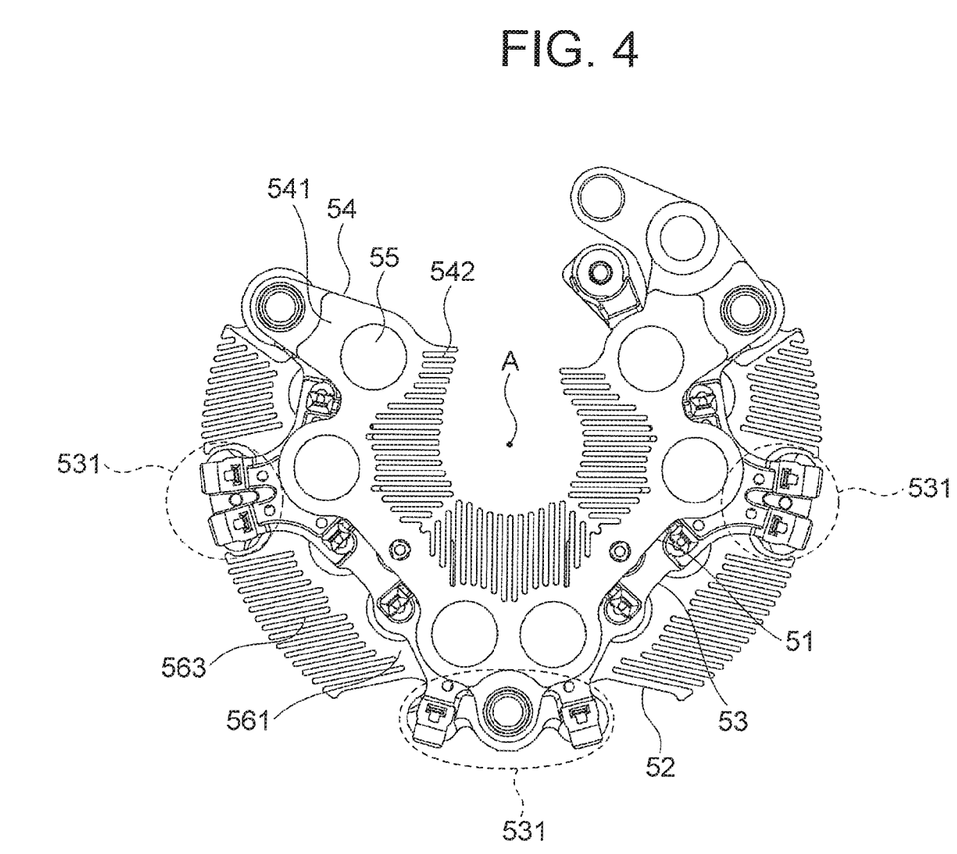
FIG. 4 is a front view showing the rectifying device as seen along an axis from the cover side in FIG. 1.

FIG. 2 is a perspective view showing the rectifying device 5 as seen from the cover 6 side in FIG. 1. Further, FIG. 3 is a perspective view showing the rectifying device 5 as seen from the power generator main body 2 side in FIG. 1. Furthermore, FIG. 4 is a front view showing the rectifying device 5 as seen along the axis A from the cover 6 side in FIG. 1. The rectifying device 5 includes a positive side rectifying unit 51 serving as a first rectifying unit that is disposed at a remove from the power generator main body 2 in the axial direction, a negative side rectifying unit 52 serving as a second rectifying unit that is disposed between the positive side rectifying unit 51 and the rear bracket 17 in the axial direction, and a circuit board 53 disposed between the positive side rectifying unit 51 and the negative side rectifying unit 52 in order to couple the positive side rectifying unit 51 and the negative side rectifying unit 52 to each other.

As shown in FIG. 4, the positive side rectifying unit 51, the negative side rectifying unit 52, and the circuit board 53 are each formed in a C shape so as to surround the axis A when seen in the axial direction. Further, the positive side rectifying unit 51, the negative side rectifying unit 52, and the circuit board 53 are disposed individually on mutually differing planes that are orthogonal to the axis A.

As shown in FIG. 2, the positive side rectifying unit 51 includes a positive side heat sink 54 serving as a first heat sink, and a plurality of positive side rectifying elements 55 (six in this example) serving as first rectifying elements provided on the positive side heat sink 54.

The positive side heat sink 54 includes a C-shaped positive side heat sink main body 541 serving as a first heat sink main body on which the positive side rectifying elements 55 are provided, and a plurality of positive side inner peripheral fins 542 serving as first inner side fins that project from an inner peripheral portion of the positive side heat sink main body 541. The positive side inner peripheral fins 542 are disposed in the direction of the axis A on a radial direction inner side of the positive side heat sink main body 541.

As shown in FIG. 3, the negative side rectifying unit 52 includes a negative side heat sink 56 serving as a second heat sink, and a plurality of negative side rectifying elements 57 (six in this example) serving as second rectifying elements provided on the negative side heat sink 56.

The negative side heat sink 56 includes a C-shaped negative side heat sink main body 561 serving as a second heat sink main body on which the negative side rectifying elements 57 are provided, a plurality of negative side inner peripheral fins 562 serving as second inner side fins that project from an inner peripheral portion of the negative side heat sink main body 561, and a plurality of negative side outer peripheral fins 563 serving as second outer side fins that project from an outer peripheral portion of the negative side heat sink main body 561. The negative side inner peripheral fins 562 are disposed in the direction of the axis A on a radial direction inner side of the negative side heat sink main body 561. The negative side outer peripheral fins 563 are disposed in the direction of the axis A on a radial direction outer side of the negative side heat sink main body 561.

As shown in FIG. 4, the positive side inner peripheral fins 542, the negative side inner peripheral fins 562, and the negative side outer peripheral fins 563 are respectively disposed in positions that deviate from a region of the circuit board 53 when seen in the axial direction. Further, a majority of the plurality of negative side inner peripheral fins 562 overlap the plurality of positive side inner peripheral fins 542 when seen in the axial direction. As a result, at least some of the gaps between the plurality of negative side inner peripheral fins 562 overlap the gaps between the plurality of positive side inner peripheral fins 542 when seen in the axial direction. Furthermore, the plurality of negative side outer peripheral fins 563 deviate further toward the radial direction outer side than respective regions of the positive side rectifying unit 51 and the circuit board 53 when seen in the axial direction. With this configuration, cooling air flowing on the radial direction inner side of the rectifying device 5 in the direction of the axis A from the cover 6 side is less likely to receive resistance from the negative side inner peripheral fins 562, and cooling air flowing on the radial direction outer side of the rectifying device 5 in the direction of the axis A from the cover 6 side is less likely to receive resistance from the positive side rectifying unit 51 and the circuit board 53.

The circuit board 53 includes a C-shaped insulating board formed from an electrical insulating material, and conductor wires embedded in the insulating board. PPS (polyphenylene sulfide) resin or the like, for example, is used as the electrical insulating material forming the insulating board. As a result, the conductor wires of the circuit board 53 are electrically insulated from components on the periphery thereof.

As shown in FIG. 3, connector wires projecting from the respective positive side rectifying elements 55 toward the negative side rectifying unit 52 are connected to the conductor wires of the circuit board 53 by positive side welding portions 551. As shown in FIG. 2, connector wires projecting from the respective negative side rectifying elements 57 toward the positive side rectifying unit 51 are connected to the conductor wires of the circuit board 53 by negative side welding portions 571. As a result, the positive side rectifying elements 55 and the negative side rectifying elements 57 are electrically connected to each other in a one-to-one relationship via the conductor wires of the circuit board 53.

In this example, as shown in FIG. 3, through holes 564 through which the positive side welding portions 551 pass are provided in the negative side heat sink main body 561 to prevent the positive side welding portions 551 from interfering with the negative side heat sink 56. Further, in this example, a potential of the negative side rectifying unit 52 is identical to a potential of the rear bracket 17, and therefore the negative side rectifying unit 52 is directly fixed to the rear bracket 17. Furthermore, in this example, the circuit board 53 and the positive side rectifying unit 51 are supported by the negative side rectifying unit 52.

A plurality of lead wires (six in this example) led out from the stator coils 15 are respectively connected to the conductor wires of the circuit board 53 by a plurality of connection portions positioned within three ranges 531 surrounded by dotted lines in FIG. 4. The connection portions in each of the ranges 531 are positioned on the radial direction outer side of the negative side heat sink main body 561. By connecting the respective lead wires to the conductor wires of the circuit board 53, the stator coils 15 are electrically connected to the rectifying device 5. In this example, a six-phase AC power generator in which the rotor 9 has 12 poles and the stator core 14 has 72 slots is used as the vehicle AC power generator 1.

Figure 5:
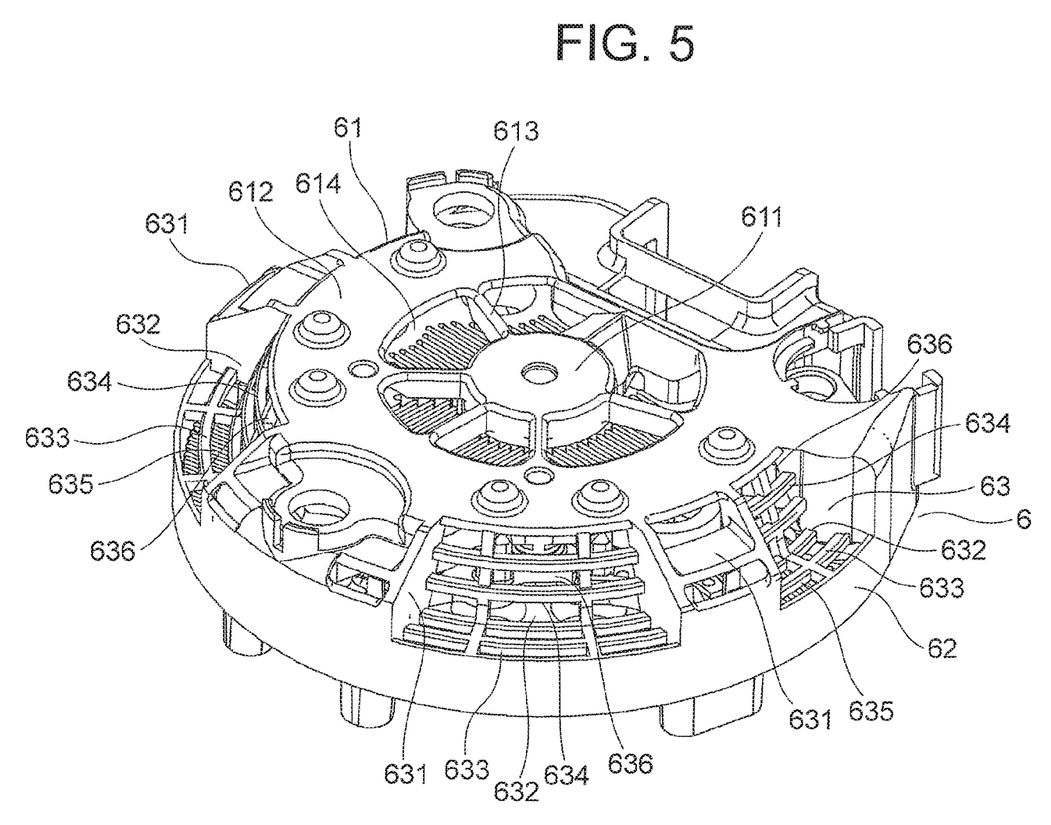
FIG. 5 is a perspective view showing a condition in which the rectifying device of FIG. 2 is covered by a cover.
Figure 6:
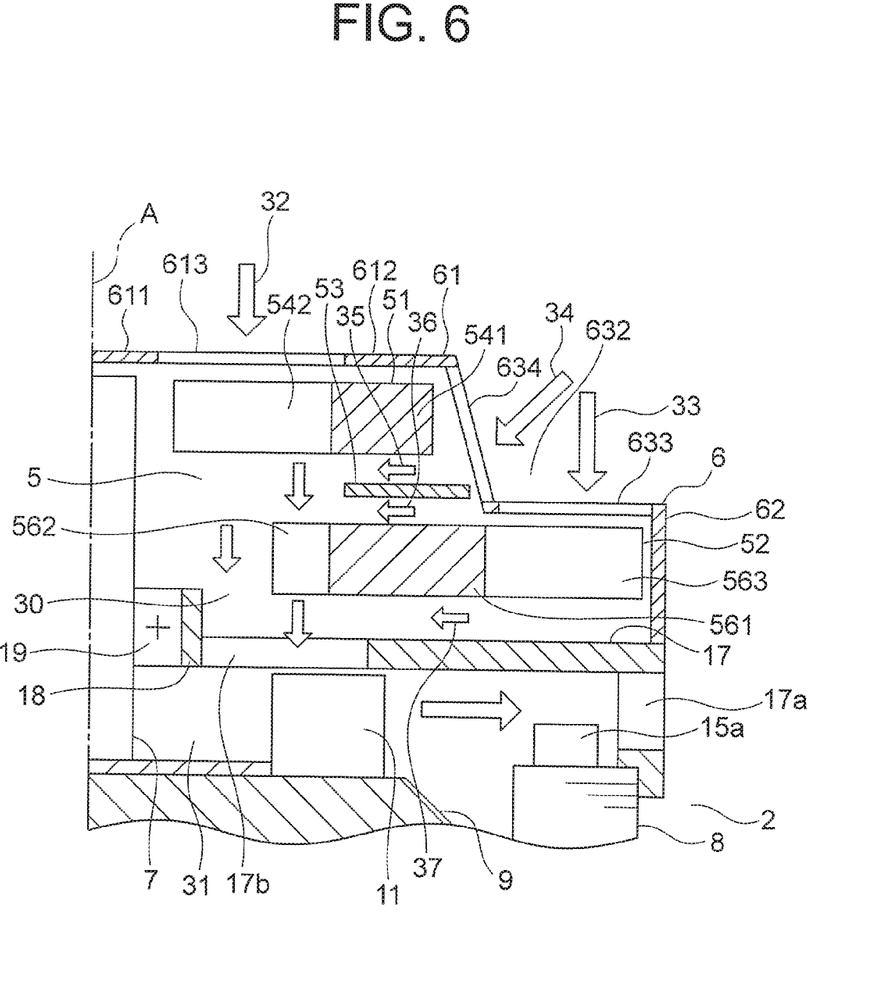
FIG. 6 is a sectional pattern diagram showing a positional relationship between the rectifying device and the cover of FIG. 1.

FIG. 5 is a perspective view showing a condition in which the rectifying device 5 of FIG. 2 is covered by the cover 6. FIG. 6 is a sectional pattern diagram showing a positional relationship between the rectifying device 5 and the cover 6 of FIG. 1. As shown in FIG. 6, gaps, or in other words spaces, exist respectively between the positive side rectifying unit 51, the negative side rectifying unit 52, and the circuit board 53. As a result, a space on the radial direction outer side of the rectifying device 5 and a space on the radial direction inner side of the rectifying device 5 communicate with each other through the gap between the positive side rectifying unit 51 and the circuit board 53 and the gap between the negative side rectifying unit 52 and the circuit board 53. A gap, or in other words a space, also exists between the negative side rectifying unit 52 and the rear bracket 17.

An amount by which the negative side inner peripheral fins 562 each project from the negative side heat sink main body 561 is smaller than an amount by which the positive side inner peripheral fins 542 each project from the positive side heat sink main body 541. As a result, a distance from an inner peripheral end portion of each negative side inner peripheral fin 562 to the axis A is greater than a distance from an inner peripheral end portion of each positive side inner peripheral fin 542 to the axis A. As shown in FIG. 6, a space 30 exists as a cooling air flow passage between an outer peripheral portion of the bearing attachment portion 18 of the rear bracket 17 and each negative side inner peripheral fin 562.

The cover 6 includes a plate-shaped cover end wall portion 61 positioned on an axial direction outer side of the rectifying device 5 when seen from the power generator main body 2, a cylindrical cover outer wall portion 62 positioned on the radial direction outer side of the rectifying device 5, and a cover intermediate portion 63 interposed between the cover end wall portion 61 and the cover outer wall portion 62.

The cover end wall portion 61 includes a disc-shaped center plate portion 611, a peripheral direction plate portion 612 surrounding the periphery of the center plate portion 611, and an inner peripheral side intake portion 613 interposed between the center plate portion 611 and the peripheral direction plate portion 612.

The center plate portion 611 and the peripheral direction plate portion 612 are respectively parts for preventing outside air from passing through. A plurality of intake holes 614 are provided in the inner peripheral side intake portion 613 and arranged in a peripheral direction. Thus, the inner peripheral side intake portion 613 allows outside air to pass through the intake holes 614. The intake holes 614 are partitioned by ribs extending from the center plate portion 611 to the peripheral direction plate portion 612.

As shown in FIG. 6, the center plate portion 611 opposes an end portion of the rotary shaft 7 in the axial direction. The inner peripheral side intake portion 613 opposes the positive side inner peripheral fins 542 in the axial direction. The peripheral direction plate portion 612 is disposed in a region between the negative side inner peripheral fins 562 and the negative side outer peripheral fins 563 when seen in the axial direction. As a result, the peripheral direction plate portion 612 is disposed so as to avoid the positive side inner peripheral fins 542, the negative side inner peripheral fins 562, and the negative side outer peripheral fins 563, respectively, when seen in the axial direction.

As shown in FIG. 5, the cover intermediate portion 63 includes a plurality of coupling portions 631 disposed at intervals from each other in the peripheral direction of the cover 6, and a plurality of outer peripheral side intake portions 632 existing respectively between the coupling portions 631.

The coupling portions 631 respectively couple an outer peripheral portion of the peripheral direction plate portion 612 to the cover outer wall portion 62. Further, when seen from the axial direction, the coupling portions 631 are disposed so as to avoid the negative side outer peripheral fins 563 while respectively overlapping the ranges 531 surrounding the connection portions by which the circuit board 53 is connected to the lead wires of the stator coils 15. In this example, three coupling portions 631 are connected to the cover end wall portion 61 and the cover outer wall portion 62. Further, in this example, four outer peripheral side intake portions 632 partitioned by the three coupling portions 631 are formed in the cover intermediate portion 63.

Each of the outer peripheral side intake portions 632 includes an axial direction covering portion 633 existing in a position that is closer to the power generator main body 2 than the cover end wall portion 61 in the axial direction, and a radial direction covering portion 634 that connects the outer peripheral portion of the peripheral direction plate portion 612 to the axial direction covering portion 633.

The axial direction covering portion 633 opposes the negative side outer peripheral fins 563 in the axial direction. Further, the axial direction covering portion 633 is disposed in a position that is closer to the negative side heat sink 56 than a board surface of the circuit board 53 in the axial direction. A plurality of intake holes 635 are provided in the axial direction covering portion 633. Thus, the axial direction covering portion 633 allows outside air to pass through the intake holes 635. The intake holes 635 are partitioned by a lattice.

The radial direction covering portion 634 exists on the radial direction inner side of the axial direction covering portion 633. Further, the radial direction covering portion 634 opposes the positive side rectifying unit 51 and the circuit board 53 in the radial direction. In this example, the radial direction covering portion 634 is tilted in a direction approaching the axis A from the axial direction covering portion 633 toward the peripheral direction plate portion 612. A plurality of intake holes 636 are provided in the radial direction covering portion 634. Thus, the radial direction covering portion 634 allows outside air to pass through the intake holes 636. The intake holes 636 are partitioned by a lattice. A total surface area of the intake holes 635, 636 provided in the respective outer peripheral side intake portions 632 is larger than a total surface area of the intake holes 614 provided in the inner peripheral side intake portion 613.

The cover outer wall portion 62 opposes the negative side rectifying unit 52 in the radial direction. Further, the cover outer wall portion 62 prevents outside air from passing through. In this example, the cover outer wall portion 62 is disposed only within a range extending between the axial direction covering portion 633 and the rear bracket 17 in the axial direction.

Next, an operation of the vehicle AC power generator 1 will be described. The field current from the battery, not shown in the figures, is supplied to the field coil 12 through the brush device 4. Accordingly, magnetic flux is generated by the field coil 12, and as a result, N poles and S poles are formed alternately in the peripheral direction on an outer peripheral portion of the pole core 13 of the rotor 9. Meanwhile, when the rotary torque of the engine is transmitted to the rotary shaft 7 via the transmission belt and the pulley 25, the rotor 9 and the fans 11 rotate integrally with the rotary shaft 7 about the axis A.

When the rotor 9 rotates in a condition where N poles and S poles are formed on the pole core 13, a rotating magnetic field of the rotor 9 acts on the respective stator coils 15 such that AC electromotive force is generated in the stator coils 15. As a result, an AC current is transmitted to the rectifying device 5 from the stator coils 15, whereupon the AC current from the stator coils 15 is rectified to a DC current by the rectifying device 5. The current rectified by the rectifying device 5 is then either charged to the battery or supplied to an electric load.

Further, when the fans 11 rotate integrally with the rotor 9, outside air is taken into the frame 10 as cooling air through the front side intake holes 16*b* on the front side, and outside air is taken into the cover 6 as cooling air respectively through the inner peripheral side intake portion 613 and the outer peripheral side intake portions 632 of the cover 6 on the rear side.

The cooling air taken into the frame 10 through the front side intake holes 16*b* is transmitted in a centrifugal direction by the rotation of the front side fan 11, and then discharged to the outside through the front side discharge holes 16*a*.

The cooling air taken into the cover 6 through the inner peripheral side intake portion 613 and the outer peripheral side intake portions 632 of the cover 6 is taken into the frame 10 through the rear side intake holes 17*b*, then transmitted in the centrifugal direction by the rotation of the rear side fan 11, and then discharged to the outside through the rear side discharge holes 17*a*.

Heat generated by the stator 8 is partly discharged from the coil ends 15*a* into the cooling air transmitted in the centrifugal direction respectively by the rotation of the front side and rear side fans 11. Another part of the heat generated by the stator 8 is conducted to the front bracket 16 and the rear bracket 17, and discharged into the cooling air from ribs respectively partitioning the front side discharge holes 16*a* and the rear side discharge holes 17*a*. As a result, the stator 8 is cooled.

The rectifying device 5 is cooled by cooling air taken into the cover 6 respectively through the inner peripheral side intake portion 613 and the outer peripheral side intake portions 632 of the cover 6.

Here, a flow of the cooling air taken into the cover 6 will be described. As shown in FIG. 6, when the rear side fan 11 rotates, a negative pressure region 31 is generated on the radial direction inner side of the rear side fan 11 such that a flow of cooling air traveling toward the negative pressure region 31 is formed. Cooling air flowing in a direction indicated by an arrow 32 in FIG. 6, or in other words the direction of the axis A, is taken into the cover 6 through the inner peripheral side intake portion 613. The cooling air taken into the cover 6 through the inner peripheral side intake portion 613 flows through the respective gaps between the positive side inner peripheral fins 542 toward the rear side fan 11, and absorbs heat generated by the positive side rectifying unit 51. As a result, the positive side rectifying elements 55 are cooled.

Next, a part of the cooling air flowing out through the respective gaps between the positive side inner peripheral fins 542 flows toward the rear side fan 11 through the respective gaps between the negative side inner peripheral fins 562 so as to absorb heat generated by the negative side rectifying unit 52, while the remaining part flows through the respective spaces 30 between the bearing attachment portion 18 of the rear bracket 17 and the negative side inner peripheral fins 562 so as to absorb heat from the bearing attachment portion 18 of the rear bracket 17. As a result, the negative side rectifying unit 52 is cooled, and the bearing attachment portion 18 and bearing 19 of the rear bracket 17 are cooled. The cooling air is then taken into the frame 10 through the rear side intake holes 17b. Thus, the cooling air taken into the cover 6 through the inner peripheral side intake portion 613 flows to the rear side intake holes 17b substantially without changing direction.

Meanwhile, cooling air taken into the cover 6 through the outer peripheral side intake portions 632 is taken into the cover 6 after being divided into cooling air flowing toward the axial direction covering portions 633 in a direction indicated by an arrow 33 in FIG. 6, and cooling air flowing toward the radial direction covering portions 634 in a direction indicated by an arrow 34 in FIG. 6. The total surface area of the intake holes 635, 636 in the outer peripheral side intake portions 632 is larger than the total surface area of the intake holes 614 in the inner peripheral side intake portion 613, and therefore a speed of the cooling air taken into the cover 6 through the outer peripheral side intake portions 632 is lower than a speed of the cooling air taken into the cover 6 through the inner peripheral side intake portion 613.

The cooling air taken into the cover 6 through the axial direction covering portions 633 flows toward the rear bracket 17 through the respective gaps between the negative side outer peripheral fins 563 so as to absorb the heat generated by the negative side rectifying unit 52. At this time, the speed of the cooling air is low, and therefore pressure loss in the cooling air caused by the negative side outer peripheral fins 563 is suppressed. As a result, the negative side rectifying elements 57 are cooled.

The cooling air that flows out through the respective gaps between the negative side outer peripheral fins 563 then flows through the gap between the rear bracket 17 and the negative side rectifying unit 52 in a direction indicated by an arrow 37 in FIG. 6, and is then taken into the frame 10 through the rear side intake holes 17b.

Further, the cooling air taken into the cover 6 through the radial direction covering portions 634 is divided into cooling air that flows through the gap between the positive side rectifying unit 51 and the circuit board 53 in a direction indicated by an arrow 35 in FIG. 6 toward the radial direction inner side of the rectifying device 5, and cooling air that flows through the gap between the circuit board 53 and the negative side rectifying unit 52 in a direction indicated by an arrow 36 in FIG. 6 toward the radial direction inner side of the rectifying device 5.

The cooling air flowing respectively in the directions indicated by the arrows 35 and 36 in FIG. 6 substantially does not come into contact with the respective fins 542, 562, 563, and therefore does not easily absorb heat from the positive side rectifying unit 51 and the negative side rectifying unit 52. Hence, the cooling air converges with the cooling air passing through the respective gaps between the positive side inner peripheral fins 542 substantially without increasing in temperature. Accordingly, the temperature of the cooling air that flows out through the respective gaps between the positive side inner peripheral fins 542 decreases, whereupon the cooling air that has decreased in temperature flows through the space 30 between the negative side heat sink 56 and the bearing attachment portion 18 and the respective gaps between the negative side inner peripheral fins 562. As a result, a temperature difference between the cooling air and the bearing attachment portion 18 and negative side rectifying unit 52 increases, enabling the cooling air to absorb heat from the bearing attachment portion 18 of the rear bracket 17 and the negative side rectifying unit 52 more easily.

In the vehicle AC power generator 1, as described above, the inner peripheral side intake portion 613 and the outer peripheral side intake portions 632 are provided in the cover 6, and the outer peripheral side intake portions 632 each include the axial direction covering portion 633 existing in a position that is closer to the power generator main body 2 than the cover end wall portion 61 in the axial direction, and the radial direction covering portion 634 that connects the axial direction covering portion 633 to the outer peripheral portion of the cover end wall portion 61. Therefore, the surface area of the outer peripheral side intake portions 632 can be increased while suppressing an increase in the size of the cover 6. Accordingly, the speed of the cooling air taken into the cover 6 through the outer peripheral side intake portions 632 can be reduced, whereby pressure loss in the cooling air flowing through the interior of the cover 6 and the interior of the frame 10 can be reduced. Further, cooling air can be supplied into the cover 6 and the frame 10 likewise through the inner peripheral side intake portion 613, and therefore the amount of cooling air taken into the cover 6 and the frame 10 can be increased. As a result, a cooling performance obtained in relation to components inside the cover 6 and the frame 10, such as the rectifying device 5, the rear bracket 17, the bearing attachment portion 18, the bearing 19, and the stator 8, for example, can be improved while suppressing an increase in the size of the vehicle AC power generator 1.

Furthermore, the negative side outer peripheral fins 563 of the negative side rectifying unit 52 are disposed so as to deviate further toward the radial direction outer side than the respective regions of the positive side rectifying unit 51 and the circuit board 53 when seen in the axial direction, and the axial direction covering portions 633 oppose the negative side outer peripheral fins 563 in the axial direction. Therefore, the low-speed cooling air taken into the cover 6 through the axial direction covering portions 633 can be supplied through the respective gaps between the negative side outer peripheral fins 563 more easily. Moreover, the speed of the cooling air remains low even when the cooling air flows between the respective negative side outer peripheral fins 563, and therefore pressure loss in the cooling air can be reduced. Accordingly, the respective gaps between the negative side outer peripheral fins 563 can be reduced in size, enabling an increase in the number of negative side outer peripheral fins 563. As a result, the cooling performance obtained in relation to the respective negative side rectifying elements 57 can be further improved.

Further, the inner peripheral side intake portion 613 opposes the positive side inner peripheral fins 542 of the positive side rectifying unit 51 in the axial direction, and therefore the cooling air taken into the cover 6 through the inner peripheral side intake portion 613 flows through the respective gaps between the positive side inner peripheral fins 542 more easily. As a result, the cooling performance obtained in relation to the positive side rectifying elements 55 can be further improved.

Furthermore, the negative side rectifying unit 52 includes the plurality of negative side inner peripheral fins 562 disposed on the radial direction inner side of the negative side heat sink main body 561 so as to extend in the axial direction, and therefore the cooling air flowing through the gaps between the plurality of positive side inner peripheral fins 542 of the positive side rectifying unit 51 can be passed through the respective gaps between the negative side inner peripheral fins 562, enabling a further improvement in the cooling performance obtained in relation to the negative side rectifying elements 57.

Moreover, gaps serving as spaces exist respectively between the positive side rectifying unit 51, the negative side rectifying unit 52, and the circuit board 53, and therefore the low-temperature cooling air taken into the cover 6 through the radial direction covering portions 634 can be led from the radial direction outer side of the rectifying device 5 to the radial direction inner side of the rectifying device 5 through the respective gaps between the positive side rectifying unit 51, the negative side rectifying unit 52, and the circuit board 53. Accordingly, the low-temperature cooling air on the radial direction outer side of the rectifying device 5 can converge with the cooling air passing through the positive side heat sink 54, whereby the temperature of the cooling air warmed by the positive side heat sink 54 can be reduced. Hence, the temperature difference between the cooling air and components further downstream than the positive side rectifying unit 51 in terms of the cooling air flow, such as the negative side rectifying unit 52, the bearing attachment portion 18 of the rear bracket 17, the bearing 19, and the stator 8, for example, can be increased, and as a result, the cooling performance obtained in relation to the components further downstream than the positive side rectifying unit 51 in terms of the cooling air flow can be further improved.

Second Embodiment

In the first embodiment, the cover outer wall portion 62 is disposed in a range that extends only between the axial direction covering portions 633 and the rear bracket 17 in the axial direction. However, a part of the cover outer wall portion 62 may project from the range extending between the axial direction covering portions 633 and the rear bracket 17 in an opposite direction to the power generator main body 2.

Figure 7:
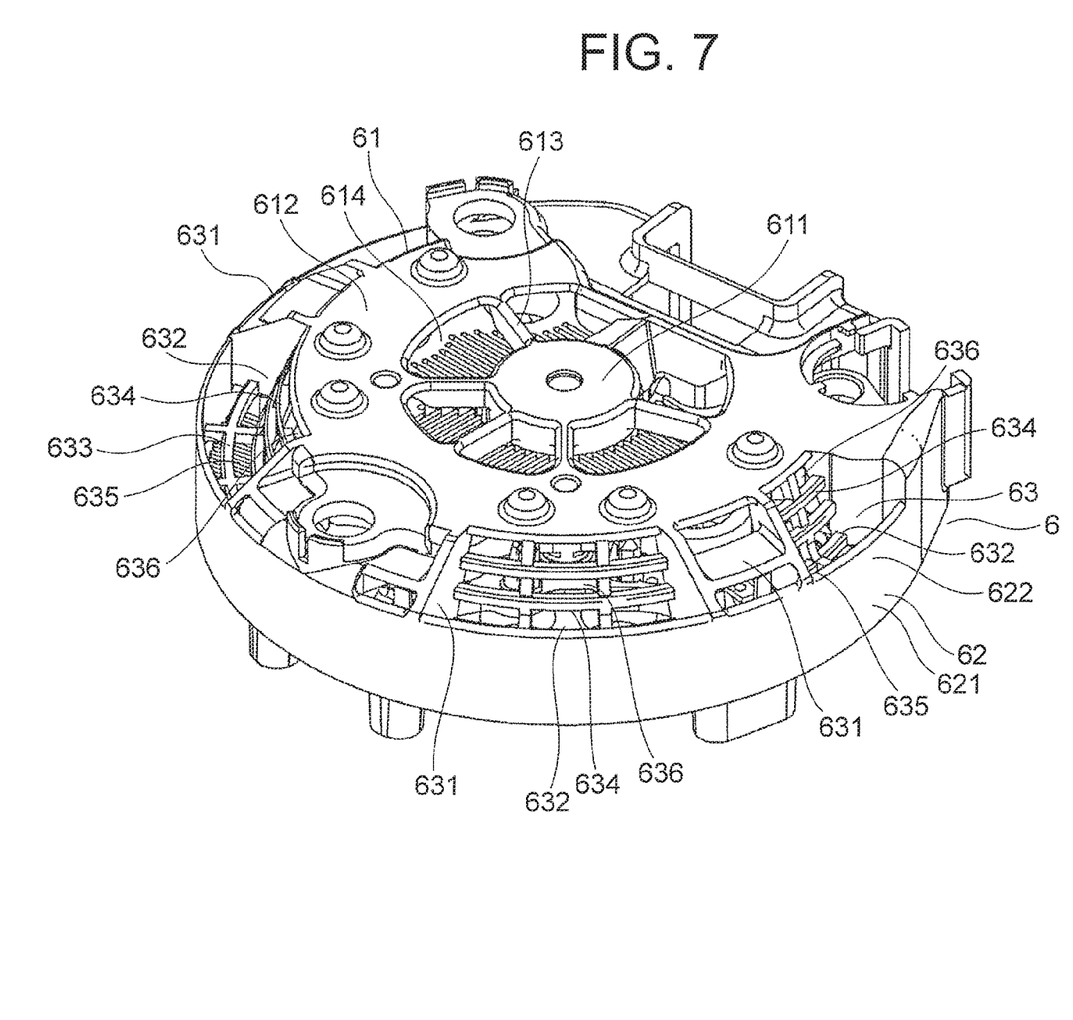
FIG. 7 is a perspective view showing a condition in which a rectifying device of a vehicle AC power generator according to a second embodiment of this invention is covered by a cover.

More specifically, FIG. 7 is a perspective view showing a condition in which the rectifying device 5 of a vehicle AC power generator according to a second embodiment of this invention is covered by the cover 6. The cover outer wall portion 62 includes an outer wall main body portion 621 disposed between the axial direction covering portions 633 and the rear bracket 17 in the axial direction, and an outer wall extension portion 622 that projects from the outer wall main body portion 621 further toward the cover end wall portion 61 side than the axial direction covering portions 633 in the axial direction.

In this example, the outer wall main body portion 621 and the outer wall extension portion 622 are disposed to extend in the axial direction. Further, in this example, an axial direction end portion of the outer wall extension portion 622 is positioned closer to the axial direction covering portions 633 than the cover end wall portion 61 in the axial direction. All other configurations are identical to the first embodiment.

In this vehicle AC power generator 1, as described above, the cover outer wall portion 62 includes the outer wall extension portion 622 that projects further toward the cover end wall portion 61 side than the axial direction covering portions 633 in the axial direction, and therefore, when the vehicle AC power generator 1 is disposed such that the radial direction covering portions 634 oppose the engine of the vehicle, for example, the outer wall extension portion 622 can protect the rectifying device 5 inside the cover 6 from radiant heat from the engine. Hence, the effect of the environment in which the vehicle AC power generator 1 is disposed on the cooling performance obtained in relation to the vehicle AC power generator 1 can be reduced, and as a result, the cooling performance obtained in relation to components such as the rectifying device 5 inside the cover 6 can be improved with stability.

Further, when an axial direction dimension of the outer wall extension portion 622 is increased, a resistance of the outer wall extension portion 622 to the cooling air increases, leading to a reduction in the amount of cooling air taken into the cover 6 through the outer peripheral side intake portions 632. Accordingly, a resistance of the inner peripheral side intake portion 613 to the cooling air decreases relative thereto, leading to an increase in the amount of cooling air taken into the cover 6 through the inner peripheral side intake portion 613. In other words, by adjusting the axial direction dimension of the outer wall extension portion 622, a ratio of the amount of cooling air taken into the cover 6 through the outer peripheral side intake portions 632 to the amount of cooling air taken into the cover 6 through the inner peripheral side intake portion 613 can be adjusted. Therefore, for example, when the temperature of the positive side rectifying elements 55 is sufficiently lower than a set allowable temperature, the dimension of the outer wall extension portion 622 can be reduced so that the cooling air actively passes through the outer peripheral side intake portions 632, and when the temperature of the negative side rectifying elements 57 is sufficiently lower than the set allowable temperature, the dimension of the outer wall extension portion 622 can be increased so that the cooling air actively passes through the inner peripheral side intake portion 613. Hence, by adjusting the dimension of the outer wall extension portion 622, a balance between the temperature of the positive side rectifying elements 55 and the temperature of the negative side rectifying elements 57 can be controlled.

Note that in the embodiments described above, this invention is applied to a vehicle AC power generator, but this invention is not limited to a vehicle AC power generator, and may also be applied to a normal AC power generator or motor/generator not installed in a vehicle.

REFERENCE SIGNS LIST

1 Vehicle AC power generator (rotary electric machine)
2 Power generator main body
5 Rectifying device
6 Cover
8 Stator
9 Rotor
10 Frame
11 Fan
51 Positive side rectifying unit (first rectifying unit)
52 Negative side rectifying unit (second rectifying unit)
53 Circuit board
61 Cover end wall portion
62 Cover outer wall portion
63 Cover intermediate portion
54 Positive side heat sink (first heat sink)
55 Positive side rectifying element (first rectifying element)
56 Negative side heat sink (second heat sink)
57 Negative side rectifying element (second rectifying element)
541 Positive side heat sink main body (first heat sink main body)
542 Positive side inner peripheral fin (first inner side fin)
561 Negative side heat sink main body (second heat sink main body)
562 Negative side inner peripheral fin (second inner side fin)
563 Negative side outer peripheral fin (second outer side fin)
613 Inner peripheral side intake portion
614, 635, 636 Intake hole
622 Outer wall extension portion
632 Outer peripheral side intake portion
633 Axial direction covering portion
634 Radial direction covering portion

The invention claimed is:

1. A rotary electric machine comprising:
a rotary electric machine main body having a stator, a rotor that rotates relative to the stator about an axis, a fan provided on an axial direction end portion of the rotor, and a frame that supports the stator and the rotor;
a rectifying device attached to the frame about the axis, and disposed on an axial direction outer side of the rotary electric machine main body; and
a cover covering the rectifying device,
wherein the cover includes a cover end wall portion positioned on the axial direction outer side of the rectifying device, a cover outer wall portion positioned on a radial direction outer side of the rectifying device, and a cover intermediate portion interposed between the cover end wall portion and the cover outer wall portion,
the cover end wall portion includes an inner peripheral side intake portion,
the cover intermediate portion includes an outer peripheral side intake portion,
the outer peripheral side intake portion includes an axial direction covering portion existing in a position that is closer to the rotary electric machine main body than the cover end wall portion in an axial direction and facing an axial direction, and a radial direction covering portion that connects the axial direction covering portion to an outer peripheral portion of the cover end wall portion and facing a radial direction,
intake holes are provided respectively in the inner peripheral side intake portion, the axial direction covering portion, and the radial direction covering portion, wherein at least one intake hole provided in the axial direction covering portion faces the axial direction and at least one intake hole provided in the radial direction covering portion faces the radial direction, and
a total surface area of the intake holes provided in the respective outer peripheral side intake portions is larger than a total surface area of the intake holes provided in the inner peripheral side intake portion.

2. The rotary electric machine according to claim 1, wherein the cover outer wall portion includes an outer wall extension portion that projects further toward the cover end wall portion side than the axial direction covering portion in the axial direction.

3. The rotary electric machine according to claim 1, wherein
the rectifying device includes a first rectifying unit, a second rectifying unit disposed between the first rectifying unit and the rotary electric machine main body in the axial direction, and a circuit board disposed between the first rectifying unit and the second rectifying unit in order to couple the first and second rectifying units to each other,
the first rectifying unit includes a first heat sink and a first rectifying element provided on the first heat sink,
the second rectifying unit includes a second heat sink and a second rectifying element provided on the second heat sink,
the second heat sink includes a plurality of second outer side fins disposed so as to extend in the axial direction,
the plurality of second outer side fins are disposed so as to deviate further toward the radial direction outer side than respective regions of the first rectifying unit and the circuit board when seen in the axial direction, and
the axial direction covering portion opposes the plurality of second outer side fins in the axial direction.

4. The rotary electric machine according to claim 3, wherein
the first heat sink includes a first heat sink main body on which the first rectifying element is provided, and a plurality of first inner side fins disposed so as to project from the first heat sink main body and extend in the axial direction on a radial direction inner side of the first heat sink main body, and
the inner peripheral side intake portion opposes the plurality of first inner side fins in the axial direction.

5. The rotary electric machine according to claim 3, wherein
the second heat sink includes a second heat sink main body on which the second rectifying element is provided, and a plurality of second inner side fins disposed so as to project from the second heat sink main body and extend in the axial direction on a radial direction inner side of the second heat sink main body, and
the plurality of second outer side fins project from the second heat sink main body, and are disposed on the radial direction outer side of the second heat sink main body.

6. The rotary electric machine according to claim 3, wherein gaps exist respectively between the first rectifying unit, the second rectifying unit, and the circuit board.

7. The rotary electric machine according to claim 1, wherein the intake holes are partitioned by a lattice in at least one of the axial direction covering portion and the radial direction covering portion.

8. A rotary electric machine comprising:
a rotary electric machine main body having a stator, a rotor that rotates relative to the stator about an axis, a fan provided on an axial direction end portion of the rotor, and a frame that supports the stator and the rotor;
a rectifying device attached to the frame about the axis, and disposed on an axial direction outer side of the rotary electric machine main body; and
a cover covering the rectifying device,
wherein the cover includes a cover end wall portion positioned on the axial direction outer side of the rectifying device, a cover outer wall portion positioned on a radial direction outer side of the rectifying device, and a cover intermediate portion interposed between the cover end wall portion and the cover outer wall portion,
the cover end wall portion includes an inner peripheral side intake portion,
the cover intermediate portion includes an outer peripheral side intake portion,
the outer peripheral side intake portion includes an axial direction covering portion existing in a position that is closer to the rotary electric machine main body than the cover end wall portion in an axial direction and facing an axial direction, and a radial direction covering portion that connects the axial direction covering portion to an outer peripheral portion of the cover end wall portion and facing a radial direction, and
a plurality of intake holes are provided respectively in the inner peripheral side intake portion, the axial direction covering portion, and the radial direction covering portion, wherein at least one intake hole provided in the axial direction covering portion faces the axial direction and at least one intake hole provided in the radial direction covering portion faces the radial direction,
the intake holes are partitioned by a lattice in at least one of the axial direction covering portion and the radial direction covering portion.

\* \* \* \* \*